(12) United States Patent
Su

(10) Patent No.: US 9,939,724 B2
(45) Date of Patent: Apr. 10, 2018

(54) PHOTOLITHOGRAPHY METHOD AND SYSTEM BASED ON HIGH STEP SLOPE

(71) Applicant: CSMC TECHNOLOGIES FAB1 CO., LTD., Jiangsu (CN)

(72) Inventor: Jiale Su, Jiangsu (CN)

(73) Assignee: CSMC TECHNOLOGIES FAB1 CO., LTD. (CN)

( * ) Notice: Subject to any disclaimer, the term of this patent is extended or adjusted under 35 U.S.C. 154(b) by 301 days.

(21) Appl. No.: 14/435,945

(22) PCT Filed: Sep. 3, 2013

(86) PCT No.: PCT/CN2013/082887
§ 371 (c)(1),
(2) Date: Apr. 15, 2015

(87) PCT Pub. No.: WO2014/063532
PCT Pub. Date: May 1, 2014

(65) Prior Publication Data
US 2015/0227048 A1    Aug. 13, 2015

(30) Foreign Application Priority Data

Oct. 23, 2012  (CN) .......................... 2012 1 0407378

(51) Int. Cl.
*G03F 1/38* (2012.01)
*G03F 7/20* (2006.01)

(52) U.S. Cl.
CPC ............... *G03F 1/38* (2013.01); *G03F 7/203* (2013.01); *G03F 7/2035* (2013.01)

(58) Field of Classification Search
CPC ..................................... G03F 7/20; G03F 1/36
See application file for complete search history.

(56) References Cited

U.S. PATENT DOCUMENTS

| 6,316,358 | B1 | 11/2001 | Shin |
| 2001/0028981 | A1 | 10/2001 | Okada et al. |
| 2006/0177744 | A1* | 8/2006 | Bodendorf .......... G03F 7/70441 430/5 |
| 2011/0101422 | A1* | 5/2011 | Akamatsu ....... H01L 21/823807 257/255 |

FOREIGN PATENT DOCUMENTS

| CN | 1293450 A | 5/2001 |
| EP | 1280009 A2 | 1/2003 |
| JP | 02-0226724 A | 10/1990 |
| JP | 2006-215330 A | 8/2006 |
| JP | 2007283480 A | 11/2007 |

OTHER PUBLICATIONS

International Search Report dated Dec. 12, 2013, cited by State Intellectual Propoerty Office of the P.R. China Patent Office, and which was cited in the international patent application PCT/CN2013/082887, dated Sep. 3, 2013, to which this application claims priority (3 pages).

* cited by examiner

*Primary Examiner* — Kathleen Duda
(74) *Attorney, Agent, or Firm* — Mark Malek; Daniel C. Pierron; Widerman Malek, PL

(57) ABSTRACT

A photolithography method and system based on a high step slope are provided. The method includes: S1, manufacturing a sacrificial layer with a high step slope on a substrate; S2, adopting a spin-on PR coating process to cover the sacrificial layer with a photoresist layer to form a photolithographic layer; S3, forming a mask pattern and a compensation pattern on a mask; and S4, performing photolithography processes, by a photolithography machine, on the photolithographic layer. By forming a slope-top compensation pattern and a slope compensation pattern on a mask to perform photolithography on the substrate of a sacrificial layer, a relatively wide compensation pattern is set in a part of the top of the slope with a small thickness, thereby compensating the overexposure at the top of the slope, reducing the error in the photolithographic pattern, and improving the precision of photolithography of the high step slope.

7 Claims, 3 Drawing Sheets

PHOTOLITHOGRAPHY METHOD AND SYSTEM BASED ON HIGH STEP SLOPE

CROSS REFERENCE TO RELATED APPLICATIONS

This is a national stage application under 35 U.S.C. § 371 of PCT patent application PCT/CN2013/082887, filed on Sep. 3, 2013, which claims the benefit of CN 2012-10407378.4, filed on Oct. 23, 2013, each of which is incorporated by reference in its entirety.

FIELD OF THE INVENTION

The present invention relates to semiconductor technologies, and more particularly relates to a photolithography method and system based on a high step slope.

BACKGROUND OF THE INVENTION

During the manufacturing of a MEMS surface movable structure, a sacrificial layer with a large thickness is often manufactured. When etching the sacrificial layer, it always requires that the etching morphology has a certain angle, before a movable layer (such as a polysilicon layer) is deposited. In the prior art, when performing a photolithography process on the slope, as the slope is relatively high (usually the height is greater than 2 μm), after spin-on PR coating, the thickness of the photoresist on the top of the slope and on the bottom of the slope will not be uniform, the photolithography energy for the bottom of the slope during the photolithography process is high, which will lead to an overexposure of patterns on the top of the slope.

Therefore, it is necessary to address the above problem and provide a photolithography method and system based on the high step slope.

SUMMARY OF THE INVENTION

Accordingly, the object of the present disclosure is to provide a high precision photolithography method and a system based on the high step slope.

In order to achieve the object of embodiments of the present disclosure, the following technical solutions are provided.

A photolithography method based on a high step slope includes:

S1, manufacturing a sacrificial layer having a high step slope on a substrate;

S2, coating a photoresist layer on the sacrificial layer by performing a spin-on PR coating process to form a photolithographic layer;

S3, forming a mask pattern and a compensation pattern on a mask, the mask pattern is a rectangular across the top of the slope, the slope, and the bottom of the slope, the compensation pattern comprises a slope-top compensation pattern and a slope compensation pattern, the slope-top compensation pattern is a rectangular corresponding to the top of the slope, a length of the rectangular is equal to a width of the slope, a width of the rectangular is greater than a width of the mask pattern, the slope compensation pattern comprises a plurality of triangles corresponding to the slope, and the slope compensation pattern is close to the mask pattern and the slope-top compensation pattern;

S4, a photolithography machine performing one or more photolithography processes to the photolithographic layer using the mask.

As a further improvement of the present disclosure, the slope-top compensation pattern and the mask pattern are axissymmetric patterns, the slope-top compensation pattern and the mask pattern use the same symmetry axis extending along a direction of the slope gradient, the slope compensation pattern comprises 4 right triangles.

As a further improvement of the present disclosure, a ratio of a width of the slope-top compensation pattern to a width of the mask pattern ranges from 1.2:1 to 1:1.

As a further improvement of the present disclosure, a ratio of a width of the slope-top compensation pattern to a width of the mask pattern is 1.1:1.

As a further improvement of the present disclosure, a height of the high step slope is greater than 2 μm, an angle of the high step slope ranges from 40° to 60°.

As a further improvement of the present disclosure, the sacrificial layer is made of TEOS or PSG.

As a further improvement of the present disclosure, a thickness of the sacrificial layer is greater than 5 μm.

A photolithography system based on a high step slope includes;

a depositing unit configured to manufacture a sacrificial layer having high step slope on a substrate;

a coating unit configured to coat a photoresist layer on the sacrificial layer by performing a spin-on PR coating process to form a photolithographic layer;

a photolithography unit configured to perform one or more photolithography processes to the photolithographic layer, the photolithography unit is provided with a plurality of masks of compensation patterns, the mask includes a mask pattern and a compensation pattern, the mask pattern is a rectangular across the top of the slope, the slope, and the bottom of the slope, the compensation pattern includes a slope-top compensation pattern and a slope compensation pattern, the slope-top compensation pattern is a rectangular corresponding to the top of the slope, a width of the rectangular is equal to a width of the top of the slope, a width of the rectangular is greater than a width of the mask pattern, the slope compensation pattern comprises a plurality of triangles corresponding to the slope, the slope compensation pattern is close to the mask pattern and the slope-top compensation pattern.

The advantages of the present disclosure are: by forming a slope-top compensation pattern and the slope compensation pattern on the mask, a photolithography process is performed to the substrate of the sacrificial layer having the high step slope, a wide compensation pattern is formed on a part of the top of the slope with a small thickness. The overexposure on the top of slope can be compensated, an error of the photolithography pattern can be reduced, a photolithography accuracy of the high step slope can be improved.

BRIEF DESCRIPTION OF THE DRAWINGS

The technical solution of the present invention will be clearly and fully described below with reference to the accompanying drawings. It is obvious that the embodiments to be described are only a part rather than all of the embodiments of the present invention. Persons skilled in the art may derive other embodiments based on the embodiments of the present invention without creative efforts, which all fall within the scope of the present invention.

DETAILED DESCRIPTION OF THE EMBODIMENTS

Figure 1:
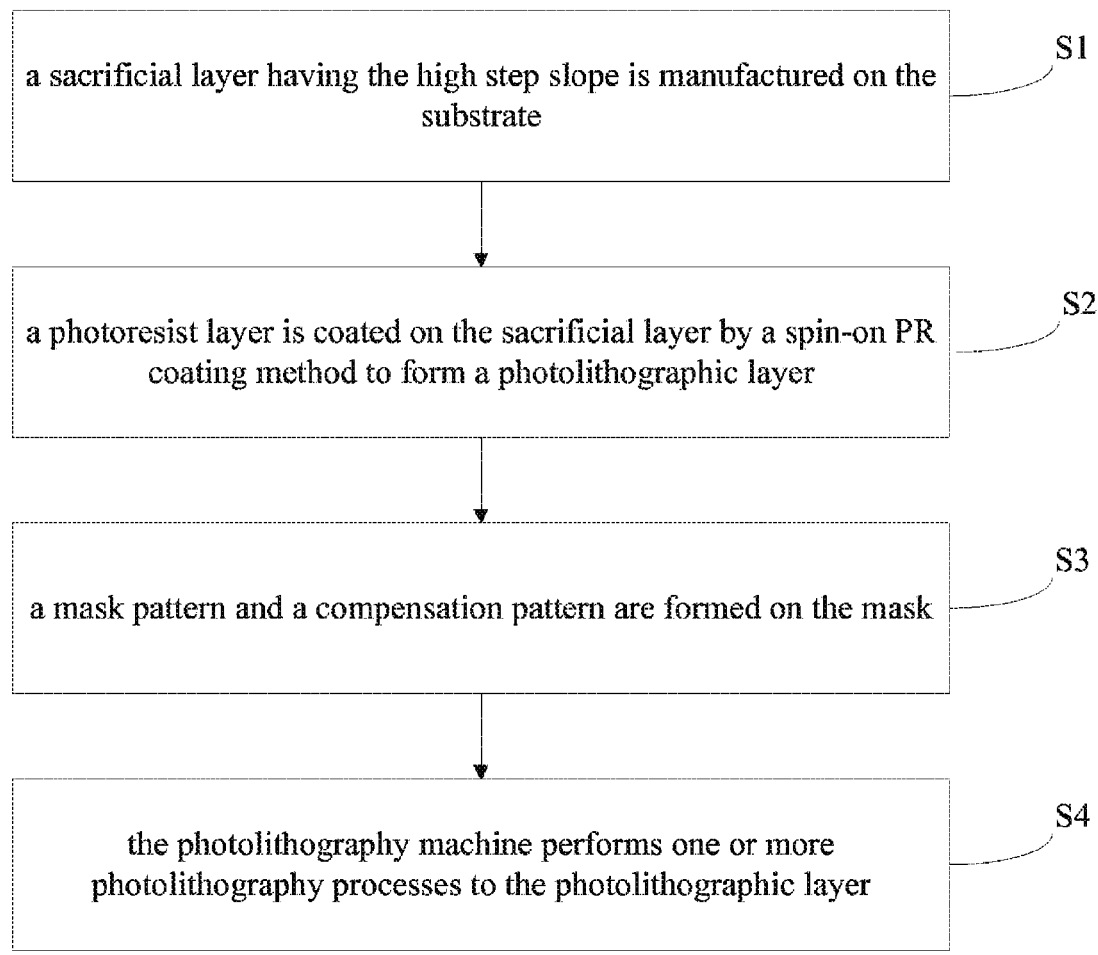
FIG. 1 is a flow chart of the photolithography method based on the high step slope according to one embodiment.

A photolithography method based on a high step slope includes the following steps.

S1, a sacrificial layer having a high step slope is manufactured on the substrate.

S2, a photoresist layer is coated on the sacrificial layer by a spin-on PR coating to form a sacrificial layer.

S3, a mask pattern and a compensation pattern on the mask are formed, the mask pattern is a rectangular across the top of the slope, the slope, and the bottom of the slope. The compensation pattern includes a slope-top compensation pattern and a slope compensation pattern. The slope-top compensation pattern is a rectangular corresponding to the top of the slope, and its length equals to the width of the top of the slope, its width is greater than the width of the mask pattern. The slope compensation pattern comprises a plurality of triangles corresponding to the slope and they are near the mask pattern and the slope-top compensation pattern.

S4, a photolithography machine performs one or more photolithography processes to the photolithographic layer using the mask.

Correspondingly, a photolithography system based on the high step slope includes:

a depositing unit configured to manufacture a sacrificial layer having the high step slope;

a coating unit configured to coat a photoresist layer on the sacrificial layer by a spin-on PR coating to form a photolithographic layer;

a photolithography unit configured to perform one or more photolithography processes to the photolithographic layer. The photolithography unit includes a mask having a plurality of compensation patterns. The mask has mask patterns and compensation patterns. The mask pattern is a rectangular across the top of the slope, the slope, and the bottom of the slope. The compensation pattern includes a slope-top compensation pattern and a slope compensation pattern. The slope-top compensation pattern is a rectangular corresponding to the slope top, a length of the slope-top compensation pattern equals to a width of the top of slope, a width of the slope-top compensation pattern is greater than a width of the mask pattern. The slope compensation pattern comprises a plurality of triangles corresponding to the slope, the slope compensation pattern is close to the mask pattern and the slope-top compensation pattern.

In the photolithography method and system based on the high step slope, the slope-top compensation pattern and the slope compensation pattern are formed on the mask, a photolithography process is performed to a substrate of the sacrificial layer having high step slope, a wide compensation pattern is set on a thin photolithographic layer on the top of the slope, the overexposure on the top of the slope is thus compensated, errors of the photolithography pattern can be reduced, a photolithography accuracy of the high step slope can be improved.

The technical solutions of the present invention will be clearly and completely described in the following with reference to the accompanying drawings. It is obvious that the embodiments to be described are only a part rather than all of the embodiments of the present invention. Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

Referring to FIG. 1, a photolithography method based on the high step slope includes:

S1, a sacrificial layer having the high step slope is manufactured on the substrate. In the illustrated embodiment, the height of the high step slope is greater than 2 µm, an angle of the slope ranges from 40° to 60°. The sacrificial layer is made of TEOS or PSG, a thickness of the sacrificial layer is greater than 5 µm.

S2, a photoresist layer is coated on the sacrificial layer by a spin-on PR coating to form a photolithographic layer.

S3, a mask pattern and a compensation pattern are formed on the mask. The mask pattern is a rectangular across the top of the slope, the slope, and the bottom of the slope. The compensation pattern includes a slope-top compensation pattern and a slope compensation pattern. The slope-top compensation pattern is a rectangular corresponding to the top of the slope, the length of the rectangular is equal to the width of the top of the slope, the width of the rectangular is greater than the width of the mask pattern. The slope compensation pattern comprises a plurality of triangles corresponding to the slope, and the slope compensation pattern is close to the mask pattern and the slope-top compensation pattern. The slope-top compensation pattern has the same symmetry axis with the mask pattern. A ratio of the width of the slope-top compensation pattern to the width of the mask pattern ranges from 1.2:1 to 1:1. Preferably, in the illustrated embodiment, the ratio of the width of the slope-top compensation pattern to the width of the mask pattern is 1.1:1. The slope compensation pattern comprises 4 right triangles.

S4, the photolithography machine performs one or more photolithography processes to the photolithographic layer.

A spin-on PR coating method in step S2 includes:

A static coating method: the silicon wafer is static, epoxy, spin up (3000 rmp), spin-on PR coating, volatile solvents (original photoresist solvent accounts for 65% to 85%, the photoresist solvent accounts for 10% to 20% after spin-on PR coating).

A dynamic coating method: slowly rotation (500 rpm), epoxy, spin up (3000 rmp), spin-on PR coating, volatile solvents.

Key parameters determining the thickness of the photoresist: the viscosity of the photoresist, the lower the viscosity the thinner the photoresist; the spin speed, the faster the spin speed the thinner the photoresist.

Parameters affecting the uniform of the photoresist: rotational acceleration, the greater the rotational acceleration the more uniform the photoresist will be, the uniform of the photoresist is related to the time of rotational acceleration.

Figure 2:
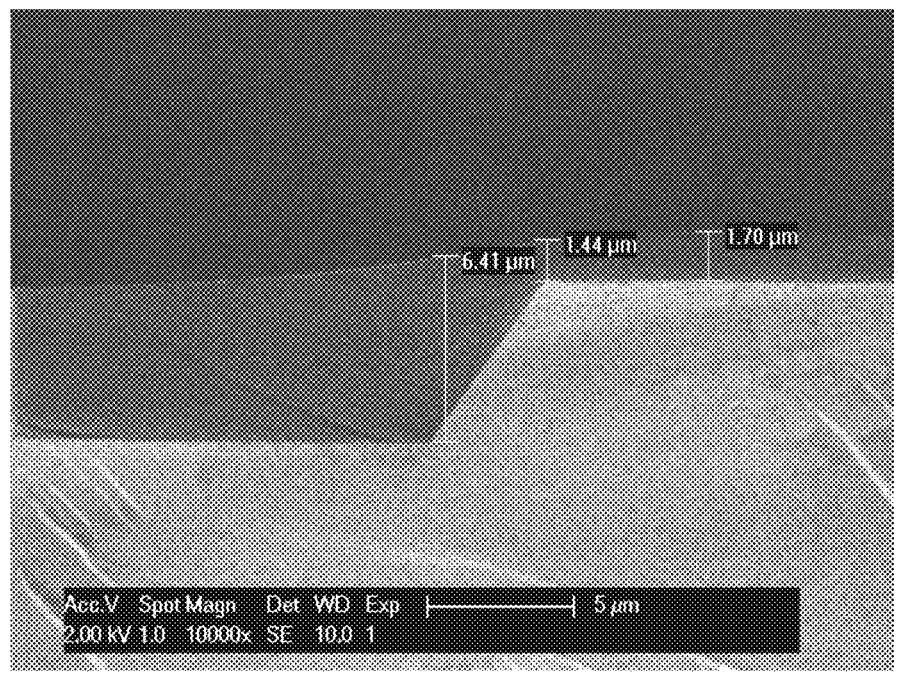
FIG. 2 is a SEM photograph showing the morphology of the photoresist on the top and the bottom of the slope after spin-on PR coating according to one embodiment.

A 3±0.3 µm wide line is manufactured on a 6 µm thick slope made of TEOS, a 6 µm thick photoresist is coated on a 6 µm thick slope, after spin-on PR coating, the morphology is shown as FIG. 2, the SEM magnification is 10000 times, a thickness of the photoresist on the top of the slope is 1.70 µm, a thickness of the photoresist on the bottom of the slope is 6.41 µm.

The mask is very important when fabricating the integrated circuit, as the mask contains pattern information of a specific layer of the integrated circuit, a horizontal structure and a size of each layer of the integrated circuit are determined by the mask. A minimum of times of performing the photolithography process in the manufacturing process is determined by the number of the masks.

A layout is needed when manufacturing the mask, the layout is a design rule determined according to the circuit, a geometric shape and size of the device, and the fabricating process of the integrated circuit. The layout is a mask pattern designed by computer aided design.

The mask pattern in the illustrated embodiment includes a plurality of compensation patterns, the compensation pattern compensates the pattern on the top of the slope and on the slope in the mask, and a line width of the pattern on the top of the slope and on the slope and on the bottom of the slope will be the same.

Figure 3:
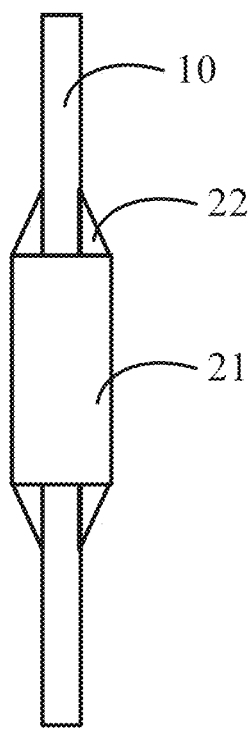
FIG. 3 is a schematic view of a mask compensation pattern of the photolithography method and system based on the high step slope according to one embodiment.

Referring to FIG. 3, the mask pattern 10 and the compensation pattern are formed on the mask. The mask pattern 10 is a rectangular across the top of the slope, the slope, and the bottom of the slope. The compensation pattern includes a slope-top compensation pattern 21 and a slope compensation pattern 22. The slope-top compensation pattern 21 is a rectangular corresponding to the top of the slope, the length of the rectangular equals to the width of the top of the slope, the width of the rectangular is greater than the width of mask pattern 10. The slope compensation pattern 22 comprises a plurality of triangles corresponding to the slope, The slope compensation pattern 22 is close to the mask pattern 10 and the slope-top compensation pattern 20. In the illustrated embodiment, the slope-top compensation pattern 21 and the mask pattern 10 are both axissymmetric patterns, and they have the same symmetry axis. The slope compensation pattern 22 comprises four right triangles, the four right triangles are located on the upper part and the lower part of the slope-top compensation pattern 21.

Preferably, the slope in the illustrated embodiment is substantially a plane, the slope compensation pattern 12 is a right triangle. In other embodiment, if the slope is a curved surface, the slope compensation pattern 12 may not a right triangle, two sides of the slope compensation pattern 12 are right angles, the other side is a curve.

After the mask pattern and the compensation pattern are formed on the mask, the patterns on the mask are aligned with the substrate having a high step slope sacrificial layer, and the substrate is exposed, thus the patterns are copied.

Correspondingly, a photolithography system based on the high step slope includes:

A depositing unit configured to manufacture a sacrificial layer having a high step slope on the substrate.

A coating unit configured to coat a photoresist layer on the sacrificial layer by performing a spin-on PR coating process to form a photolithographic layer.

A photolithography unit configured to perform one or more photolithography processes to the photolithographic layer, the photolithography unit includes a mask having a mask pattern and a compensation pattern.

Referring to FIG. 3, a mask pattern 10 and a compensation pattern are formed on the mask, the mask pattern 10 is a rectangular across the top of the slope, the slope, and the bottom of the slope. The compensation pattern includes a slope-top compensation pattern 21 and a slope compensation pattern 22. The slope-top compensation pattern 21 is a rectangular corresponding to the top of the slope, a length of the rectangular is equal to the width of the slope, a width of the rectangular is greater than the width of the mask pattern 10. The slope compensation pattern 22 comprises a plurality of triangles corresponding to the slope, the slope compensation pattern 22 is close to the mask pattern 10 and the slope-top compensation pattern 20. In the illustrated embodiment, the slope-top compensation pattern 21 and the mask pattern 10 have the same symmetry axis. The slope compensation pattern 22 comprises 4 right triangles, the 4 right triangles are located on the upper part and on the lower part of the slope-top compensation pattern 21.

Preferably, the slope in the illustrated embodiment is substantially a plane, the slope compensation pattern 22 is right triangles. In an alternative embodiment, if the slope is a curved surface, the slope compensation pattern may not be right triangles, the slope compensation pattern can be set as that two sides are right triangles, and the other side is a curve.

Figure 4:
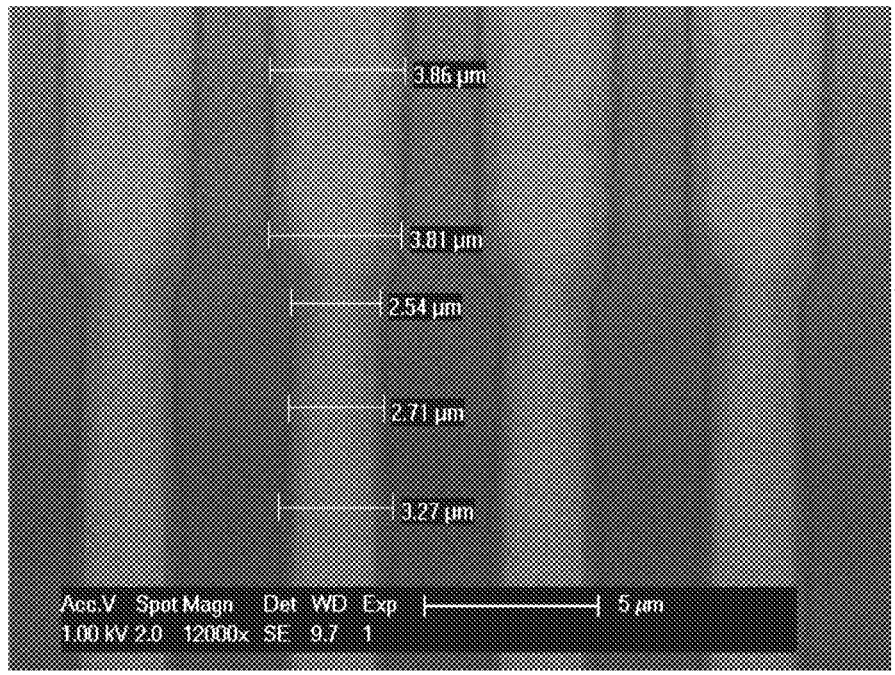
FIG. 4 is a SEM photograph showing the morphology of a sacrificial layer after a photolithography process without using a mask of the compensation pattern in the prior art.
Figure 5:
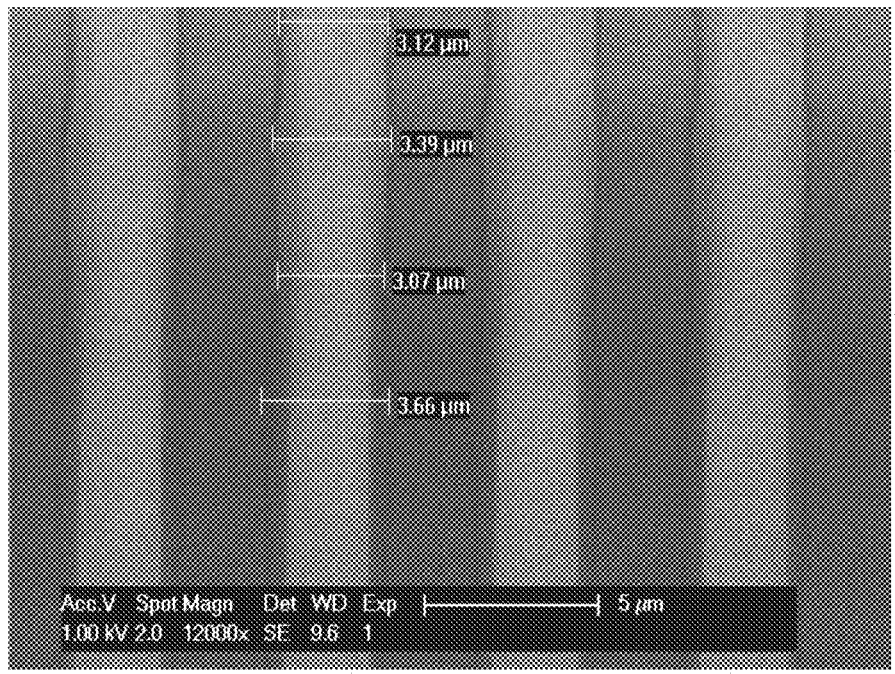
FIG. 5 is a SEM photograph showing the morphology of the sacrificial layer after photolithography process using the mask of the compensation pattern.

Referring to FIG. 4 and FIG. 5, FIG. 4 is a morphology of the sacrificial layer after exposing without using the compensation pattern, and FIG. 5 is a morphology of the sacrificial layer after exposing using the mask of the compensation pattern.

A compensation pattern is not used when obtaining FIG. 4, a thickness of the photoresist on the top of the slope is smaller than a thickness of the photoresist on the slope and on the bottom of the slope, thus the top of the slope may be over exposed, the slope may also be over exposed in some extent, and the photolithography line width on the top of the slope is large, the photolithography line width on the bottom of the slope is small. Referring to FIG. 4, the SEM magnification is 12000 times, the top of the slope and the bottom of the slope are measured, the line widths are 186 µm, 3.81 µm, 2.54 µm, 2.71 µm, and 3.27 µm respectively, the line width has an error of about 1 µm, which cannot meet the requirement of high precision photolithography.

A mask of the compensation pattern is used to expose when obtaining FIG. 5. On the top of the slope where a thickness of the photoresist is small, a wide compensation pattern is formed on the mask, it can be used to compensate the overexposure. Referring to FIG. 5, the SEM magnification is 12000 times, the top and the bottom of the slope are measured, the line widths are 3.12 µm, 3.39 µm, 3.07 µm, and 3.66 µm respectively, the line width of the pattern is about 3.3 µm, an error of the line width is smaller than 0.6 µm, which meets an accuracy requirement of ±0.3 µm.

The slope-top compensation pattern and the slope compensation pattern are formed on the mask, a photolithography process is performed to the substrate of the sacrificial layer having the high step slope, a wide compensation pattern is formed on a part of the top of the slope with a small thickness. The overexposure on the top of slope can be compensated, an error of the photolithography pattern can be reduced, a photolithography accuracy of the high step slope can be improved.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A photolithography method based on a high step slope, comprising:

S1, manufacturing a sacrificial layer having a high step slope on a substrate;

S2, coating a photoresist layer on the sacrificial layer by performing a spin-on PR coating process to form a photolithographic layer;

S3, forming a mask pattern and a compensation pattern on a mask, wherein the mask pattern is a rectangular across the top of the slope, the slope, and the bottom of the slope, the compensation pattern comprises a slope-top compensation pattern and a slope compensation pattern, the slope-top compensation pattern is a rectangular corresponding to the top of the slope having a length equal to a width of the slope, and a width greater than a width of the mask pattern, the slope compensation pattern comprises a plurality of triangles corresponding to the slope adjacent to the mask pattern and the slope-top compensation pattern;

S4, performing one or more photolithography processes, by a photolithography machine, to the photolithographic layer using the mask.

2. The method according to claim 1, wherein the slope-top compensation pattern and the mask pattern are axisymmetric patterns, and the slope-top compensation pattern and the mask pattern share the same symmetry axis extending along a direction of the slope gradient, the slope compensation pattern comprises four right triangles.

3. The method according to claim 2, wherein a ratio of a width of the slope-top compensation pattern to a width of the mask pattern ranges from 1.2:1 to 1:1.

4. The method according to claim 2, wherein a ratio of a width of the slope-top compensation pattern to a width of the mask pattern is 1.1:1.

5. The method according to claim 1, wherein a height of the high step slope is greater than 2 μm, an angle of the high step slope ranges from 40° to 60°.

6. The method according to claim 1, wherein the sacrificial layer is made of tetraethyl orthosilicate or phosphosilicate glass.

7. The method according to claim 6, wherein a thickness of the sacrificial layer is greater than 5 μm.

* * * * *